United States Patent [19]
Beaumont et al.

[11] Patent Number: 5,494,856
[45] Date of Patent: Feb. 27, 1996

[54] APPARATUS AND METHOD FOR CREATING DETACHABLE SOLDER CONNECTIONS

[75] Inventors: Guy D. Beaumont; Denis Labbe; Alain Warren, all of Granby, Canada

[73] Assignee: International Business Machines Corporation, Armonk, N.Y.

[21] Appl. No.: 324,938

[22] Filed: Oct. 18, 1994

[51] Int. Cl.$^6$ ................................. H01L 21/60
[52] U.S. Cl. .................. 437/209; 437/8; 437/189; 437/192
[58] Field of Search .................. 437/7, 8, 189, 437/192, 200, 209, 211, 214, 215, 216, 217, 218, 219, 220

[56] References Cited

U.S. PATENT DOCUMENTS

| | | | |
|---|---|---|---|
| 4,360,142 | 11/1982 | Carpenter et al. | 228/123 |
| 4,526,859 | 7/1985 | Christensen et al. | 430/314 |
| 4,740,099 | 4/1988 | Philipoussi | 403/2 |
| 4,792,532 | 12/1988 | Ohtani et al. | 437/8 |
| 4,870,224 | 9/1989 | Smith et al. | 174/52.4 |
| 5,007,163 | 4/1991 | Pope et al. | 29/840 |
| 5,052,481 | 10/1991 | Horvath et al. | 165/185 |
| 5,170,930 | 12/1992 | Dolbear et al. | 228/123 |
| 5,173,451 | 12/1992 | Kinsman et al. | 437/209 |
| 5,237,269 | 8/1993 | Aimi et al. | 324/158 |
| 5,268,072 | 12/1993 | Agarawala et al. | 437/192 |
| 5,289,631 | 3/1994 | Koopman et al. | 437/8 |
| 5,298,459 | 3/1994 | Arikawa et al. | 437/192 |
| 5,334,804 | 8/1994 | Love et al. | 174/267 |
| 5,376,584 | 12/1994 | Agarwala | 437/189 |
| 5,447,264 | 9/1995 | Koopman et al. | 228/56.3 |

OTHER PUBLICATIONS

P. J. Lueck, IBM Technical Disclosure Bulletin, vol. 36, No. 03, Mar. 1993, "Burn-in/In Situ Testing of Computer Chips".
E. Anemojanis, et al., IBM Technical Disclosure Bulletin, vol. 34, No. 8, Jan. 1992, "Wafer Level Test and Burn-In".

*Primary Examiner*—Brian E. Hearn
*Assistant Examiner*—Kevin M. Picardat
*Attorney, Agent, or Firm*—Aziz M. Ahsan

[57] ABSTRACT

A method is provided for creating solder connections between two surfaces which connections are relatively weak and thus can be readily fractured for separating the surfaces. The preferred application of the disclosed process is its use in connecting semiconductor chips to a carrier in order to conduct burn-in tests on the chips. The process consists of a series of steps to form a surface having a matrix of solder wettable and solder non-wettable areas on the pads of the carrier. Once the solder balls on the chip are attached to the treated pads on the carrier, electrical contacts are made and the chip can be readily removed after the test. The uniquely configured carrier can then be reused numerous times for testing or burning-in chips.

22 Claims, 2 Drawing Sheets

APPARATUS AND METHOD FOR CREATING DETACHABLE SOLDER CONNECTIONS

FIELD OF THE INVENTION

The present invention relates to structure and processes for temporarily attaching two elements or surfaces together by making use of a mixture of solder wettable and solder non-wettable areas between the contacting surfaces. More specifically, the present invention relates to temporarily attaching an integrated circuit chip to a carrier for burn-in test purposes, making use of a mixture or matrix of solder wettable and solder non-wettable areas between electrical contact points of the chip and the carrier, such that the connection between the contact points are detachable and the chip can be easily removed after the tests have been conducted, and the chip and the substrate can be re-used without mechanical damage to the chip or the carrier. The invention also includes a semiconductor chip carrier having connecting pads which include areas of one or more solder wettable and one or more solder non-wettable materials.

BACKGROUND OF THE INVENTION

As technology evolves, semiconductor devices are becoming smaller and more dense resulting in corresponding increases in overall chip failure rates, which in turn results in uncompetitive situations for chip manufacturers. There is therefore a need and desire by manufacturers of chips and semiconductor devices to be able to readily identify and eliminate the use of defective chips before the defective chips are finally mounted in a product.

Burn-in processes have evolved and have been developed in an effort to identify and eliminate the use of defective chips. A chip carrier is provided, which typically is a substrate, for testing the chips. The chip carrier has electrical contacts which correspond to the electrical contacts on the semiconductor chip. It is desirable for the carrier contacts to be mechanically weak but strong enough for holding the semiconductor chip in place during testing and to maintain good electrical connections. The chip is normally positioned on the chip carrier so that the solder balls on the chip are aligned with the corresponding contacts on the carrier and then the solder balls are partially reflowed to make electrical connections between the chip and the carrier. It is desirable to provide for the easy removal of the chip from the carrier after the burn-in test so that defective chips can be discarded or used elsewhere and good chips can be identified and permanently used. The carrier can then be re-used for testing of further similar chips. It is thus desirable to be able to temporarily attach the semiconductor chip to the carrier in such a way that it can be readily separated after the burn-in test without mechanical damage to either the chip or the carrier.

In general, the burn-in test exercises or operates the chip at elevated voltage and temperature levels for an extended period of time in order to simulate the actual operation of the chip for its normal and expected lifetime in a final product by monitoring the electrical responses of the chip and thus be ensured of its proper operation without failing. This procedure is well known to those familiar with this semiconductor technology.

A variety of processes and techniques have been devised and described in the prior art to form a temporary connection between semiconductor chips and carriers, so as to be able to readily separate the chip and the carrier after burn-in tests have been conducted. For Example:

U.S. Pat. No. 5,237,269 (Aimi et al.) issued Aug. 17, 1993, and assigned to International Business Machines Corporation, the disclosure of which is incorporated herein by reference, describes connections between circuit chips and temporary carriers for use in burn-in tests whereby the pads on a ceramic substrate are covered by an overlay of non-wettable material to which solder will not adhere whereby the overlay has an opening through which solder flows to make a restricted joint between the solder ball of the chip and the lead line of the carrier;

U.S. patent application Ser. No. 24,549, entitled "Method And Apparatus For In-Situ Testing of Integrated Circuit Chips", filed Mar. 1, 1993, (Attorney Docket No. EN9-93-001), assigned to International Business Machines Corporation, the disclosure of which is incorporated herein by reference, provides a method and apparatus for in-situ testing of integrated circuit chips whereby the electrical contacts between the semiconductor chips to be tested and those of the carrier are made by means of dendritic surfaces such that there are vertical projections between the contacts resulting in a fracturable joint;

U.S. Pat. No. 5,173,451 (Kinsman, et al.) issued Dec. 22, 1992, to Micron Technology Inc., provides for a soft bond for semiconductor dies wherein a reduced sized wire bond is used to create a readily fracturable joint to separate the chip from the carrier such that less bonding force is required to retain the lead wires to the carrier than the attachment strength of the pads on the chip;

U.S. Pat. No. 5,007,163 (Pope et al.), issued Apr. 16, 1991, to International Business Machines Corporation, the disclosure of which is incorporated herein by reference, describes a non-destructive method of performing electrical burn-in testing of semiconductor chips by making use of a eutectic mixture which remains liquid at certain temperatures for forming a readily fracturable connection;

IBM Technical Disclosure Bulletin, "Burn-In/In Situ Testing of Computer Chips", Volume 36, No. 3, pp. 229–231 (March 1993), describes burn-in testing of semiconductor chips in which no permanent connection between the chip contact and the substrate is required which results from limited area pads with smaller solder ball carrier surfaces; and IBM Technical Disclosure Bulletin, "Wafer Level Test And Burn-In", Volume 34, No. 8, pp. 401–404 (January 1992), describes burn-in testing of a wafer containing semiconductor chips on a carrier such that the contact pads between the contacts are made of two-level solder structure with a small contact area between the two levels. The two levels are comprised of high melting point solder and low melting point solder.

The methods and devices described in these aforementioned references are useful in many applications where it is desired to have detachable connections between the contacts of a carrier and chip for chip burn-in situations, but this may not be useful in all circumstances. For example, for use in testing chips for multilayer ceramic devices which have a large number of connections, in some cases up to 2,800 connections, known methods are limited and may not be usable. With this large number of connections the overall strength of the connection between the carrier and chip is relatively high which may result in damage to the chip or the carrier upon the removal of the chip from the carrier. Thus there is a need for every individual connection to be relatively weak. It may be difficult, if not impossible, for example, to design a mask with any precision that will have the needed definition for such a large number of small holes to accommodate this number of connections. It is also difficult with the required number of smaller holes to have the solder balls on the chips to be accurately positioned in the holes. The presently proposed processes and chip carrier do not require changes to the presently configured chip solder balls.

Other references have been identified which disclose a variety of techniques for providing temporary or detachable connections between two surfaces in general, or as may be applied in particular applications to semiconductor devices. These include for example:

U.S. Pat. No. 5,170,930 (Dolbear et al.), issued Dec. 15, 1992, to Microelectronics and Computer Technology Corporation, describes the use of a thermally and electrically conductive paste for making a detachable connection between two surfaces;

U.S. Pat. No. 4,740,099 (Philipoussi), issued Apr. 26, 1988, to Societe Nationale Industrielle Aerospatiale, describes an arrangement for temporarily soldering plates together such that they can be mechanically released. This is accomplished by restricting the areas to which the solder can be applied. The fracturable connection results from areas which are limited for the application of solder;

U.S. Pat. No. 4,526,859 (Christensen, et al.), issued Dec. 12, 1983, to International Business Machines Corporation, the disclosure of which is incorporated herein by reference, discloses a method of selectively metallizing a ceramic substrate provided with a metallization pattern using photoresist processing; and U.S. Pat. No. 4,360,142 (Carpenter et al.), issued Nov. 23, 1982, to International Business Machines Corporation, the disclosure of which is incorporated herein by reference, describes solder connections for electrically joining semiconductor devices to a supporting substrate.

Although it would appear that the teachings of these prior art references have found some usefulness in some situations and applications where a detachable connection is required, they do not provide completely satisfactory solutions for all situations, particularly where the increasing complexities and miniature size of semiconductor devices is concerned.

It is therefore desirable to provide a new method of temporarily connecting semiconductor chips to a carrier for burn-in purposes which has not been described in the aforementioned prior art and which result in beneficial and practical testing of chips to readily permit the identification of those chips which may be defective and those which are good and can be used in final products. It is also desirable to provide a new semiconductor chip carrier which can be re-used in the testing and identification of defective and good chips.

PURPOSES AND SUMMARY OF THE INVENTION

It is one purpose of the present invention to provide a novel structure and method of temporarily attaching two elements or surfaces together by forming a layer which provides a combination, mixture or matrix of at least one solder wettable and at least one solder non-wettable areas.

Another purpose of the invention is to provide a connection which has limited strength of adhesion.

Still another purpose of this invention which is found to be particularly useful is its application in the burn-in testing of semiconductor chips, and this invention may be useful in other applications, such as, where there is a need for temporary mechanical connections.

Yet another purpose of this invention is to provide a connection between a chip and a carrier, which connection can be readily fractured and the carrier may be re-used many times for testing other chips.

According to one aspect of the present invention, there is provided a process for creating a temporary and detachable connection between a first surface which is non-wettable by solder and a second surface having a source of solder, comprising the steps of: preparing said first surface to adhere a film of wettable material; depositing a film of wettable material on said first surface; combining the wettable material into said first surface; removing excess wettable material to thereby leave a surface having minute areas of materials wettable and non-wettable to solder; overlaying said second surface onto said areas of materials wettable and non-wettable to solder on said first surface; and reflowing the solder of said second surface to thereby form a temporary and detachable connection between said first and second surfaces.

According to another aspect of the present invention there is provided a process for creating a temporary and detachable connection between a first surface which is wettable by solder and a second surface having a source of solder, comprising the steps of preparing said first surface to adhere a film of non-wettable material, depositing a film of non-wettable material onto said first surface, combining the non-wettable material into said first surface, removing excess non-wettable material to thereby leave a surface having minute areas of materials wettable and non-wettable to solder, overlaying said second surface onto said areas of materials wettable and non-wettable to solder on said first surface, and reflowing the solder of said second surface to thereby form a temporary and detachable connection between said first and second surfaces.

According to yet another aspect of the present invention, there is provided a process for creating detachable electrical connections between solder balls of a semiconductor chip and connecting pads of a carrier wherein the pads consist of a material which is non-wettable, by forming areas on the pads which consist of a matrix of wettable and non-wettable materials, such that the chip can be readily removed from the carrier with minimal damage to the chip and carrier, comprising the steps of: levelling the pads of the carrier to ensure that they are substantially flush with the surface of the carrier; treating each pad in order to create a roughened surface; plating a film of wettable material onto said pads; diffusing the film into the non-wettable material of the pads; removing a portion of the wettable material which has not diffused into the pad material; plating a further film of the wettable material onto the diffused surface; removing a portion of the further film of wettable material; mounting the chip on the carrier such that the solder balls of the chip coincide and overlay the treated contact pads of the carrier; and reflowing the solder of said contact balls in order to make electrical connections between the chip and the carrier.

According to a further aspect of the present invention, there is provided a semiconductor chip carrier to which a semiconductor chip is attached in order to carry out burn-in tests on the chip, said carrier including a plurality of connecting pads to which a corresponding plurality of solder balls on the chip are connected, the improvement comprising the surface of each of the connecting pads on the carrier consists of areas of wettable and non-wettable materials.

In yet another aspect this invention comprises a process for creating a temporary and detachable connection between one surface which is partially non-wettable by solder and a second surface having a source of solder, comprising the steps of:

(a) preparing a first surface having solder non-wettable material to adhere a film of solder wettable material;

(b) depositing a film of solder wettable material onto said first surface;

(c) heating said solder wettable material such that at least a portion of said solder wettable material combines with said solder non-wettable material of said first surface;

(d) removing excess solder wettable material from said first surface and creating a third surface, wherein said third surface has areas of solder wettable material and solder non-wettable materials;

(e) overlaying said second surface having said source of solder onto said third surface having said regions of solder wettable material and solder non-wettable material; and (f) reflowing said solder of said second surface to thereby form a temporary and detachable connection between said third surface which is partially non-wettable by solder and said second surface.

In still yet another aspect this invention comprises a process for creating a temporary and detachable connection between one surface which is partially non-wettable by solder and a second surface having a source of solder, comprising the steps of:

(a) preparing a first surface having solder wettable material to adhere a film of solder non-wettable material;

(b) depositing a film of solder non-wettable material onto said first surface;

(c) heating said solder non-wettable material such that at least a portion of said solder non-wettable material combines with said solder wettable material of said first surface;

(d) removing excess solder non-wettable material from said first surface and creating a third surface, wherein said third surface has areas of solder wettable material and solder non-wettable materials;

(e) overlaying said second surface having said source of solder onto said third surface having said regions of solder wettable material and solder non-wettable material; and (f) reflowing said solder of said second surface to thereby form a temporary and detachable connection between said third surface which is partially non-wettable by solder and said second surface.

In yet another aspect this invention comprises a process for creating detachable electrical connections between solder balls of a semiconductor chip and connecting pads of a carrier wherein the pads consist of a material which is solder non-wettable, by forming areas on the pads which consist of a matrix of solder wettable and solder non-wettable materials such that the chip can be readily removed from the carrier with minimal damage to the chip and carrier, comprising the steps of:

(a) treating each pad in order to create a roughened surface;

(b) plating a film of solder wettable material onto said treated pads;

(c) diffusing said film of solder wettable material into said solder non-wettable material of said pads;

(d) removing excess portion of said solder wettable material which has not diffused into said pad from said pad;

(e) plating at least one additional film of at least one solder wettable material onto the diffused surface of step (c);

(f) removing excess portion of said additional film of said solder wettable material;

(g) mounting said chip on said carrier such that said solder balls of said chip coincide and overlay said treated contact pads of said carrier; and (h) reflowing said solder of said solder balls in order to make electrical connections between said chip and said carrier.

In still yet another aspect this invention comprises a semiconductor chip carrier to which a semiconductor chip is attached in order to carry out burn-in tests on said chip, said carrier including a plurality of connecting pads to which a corresponding plurality of solder balls on said chip are connected, the improvement comprising the surface of each of said connecting pads on said carrier consists of areas of solder wettable and solder non-wettable materials.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1A:
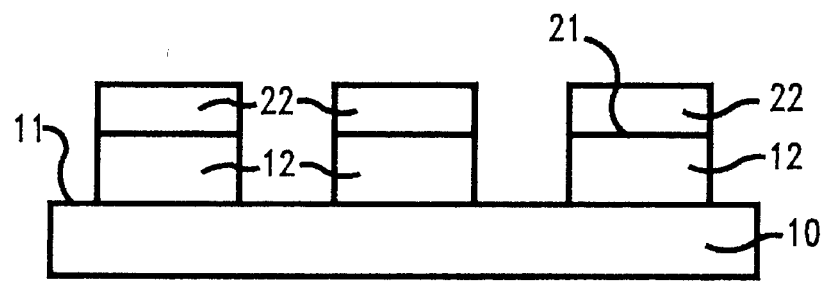
FIG. 1A, illustrates one embodiment of the invention.
Figure 1B:
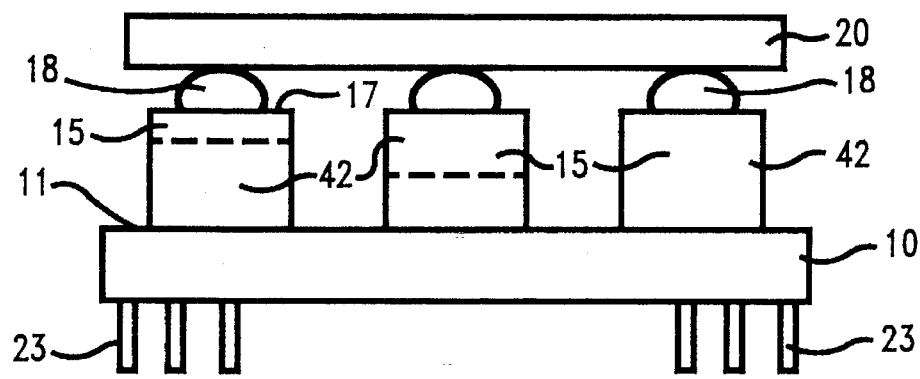
FIG. 1B, illustrates another embodiment of the invention.

Referring to FIGS. 1A and 1B, a carrier or substrate 10, is used to which a semiconductor chip 20, is temporarily attached in order to perform burn-in tests on the chip 20. Typically, the upper surface 11, of the carrier 10, consists of an arrangement of connecting pads 12, to which the chip 20, is electrically attached by correspondingly positioned and configured solder balls 18, attached to the chip 20. The pads 12, on the surface 11, of the carrier 10, communicate with electrically conducting vias through the body of the carrier 10, which provide for connections to external leads 23, in order to apply power to the chip 20, and monitor outputs from the chip 20, during the burn-in tests.

It is desirable to be able to re-use the carrier 10, many times for the burn-in testing of different chips 20. The unique configuration of the carrier 10, to be subsequently described and resulting from the described processes provides for numerous re-uses of the carrier 10.

Similarly, there is a desire to be able to remove the tested chip 20, from the carrier 10, without damaging the chip 20, or any of its components, such as, solder balls 18. The tested chip 20, that has passed the burn-in test is also known in the industry as KGD or Known Good Die.

The preferred process embodiment to describe one aspect of the present invention is in the creation of a detachable connections between a chip 20, and a carrier 10. It involves creating a layer or surface or region 15, as more clearly shown in FIG. 2, of a mixture, matrix or regions of solder wettable areas 14, and solder non-wettable areas 16, on the contact pads 42, of the substrate or carrier 10, onto which the chip 20, is to be mounted. This region 15, is formed between the aligned contacts on the carrier 10, and the chip 20.

Basically, FIG. 1A, illustrates a carrier or substrate 10, having at least one pad 12, on the upper surface 11, of the carrier or substrate 10. A layer of material 22, is then formed over the upper surface 21, of the pad 12.

If the material for the pad 12, is a solder wettable material then the material for the pad 22, has to be a solder non-wettable material. On the other hand, if the material for the pad 12, is a solder non-wettable material then the material for the pad 22, has to be a solder wettable material.

FIG. 1B, illustrates the temporary joining of the semiconductor chip 20, via solder balls 18, to the upper surface 17, of the connecting pad 42. The connecting pad 42, has region 15, which is the result of the processing of the pad materials 12 and 22, thus creating the region 15, of solder wettable material 14, and solder non-wettable material 16. The layer or surface or region 15, can also be referred to as pad 15 or pad 42.

Now, going back to FIG. 1A, the surface 11, of the carrier 10, in particular the surface 21, of the pads 12, must be properly treated and prepared in order to provide for the temporary connection to the solder balls 18, of the chip 20, in accordance with the subject invention.

Typically, the contact pads 12, and vias of the carrier 10, are made of electrically conducting material which is non-wettable to solder. One example of this solder non-wettable material is a mixture of molybdenum, aluminum oxide (or alumina) and glass frit.

However, it should be understood and appreciated that other or alternative solder non-wettable materials could be used, such solder non-wettable materials could include, but not limited to, molybdenum, tungsten, chrome, alumina/molybdenum and mixtures thereof, to name a few.

The term "wettable" as used in this disclosure means that the material is solderable, weldable or capable of metallic adhesion, and thus in general refers to metals which are capable of being soldered.

In a similar manner "non-wettable" materials as used herein generally refer to those materials which are not capable of being soldered or capable of having solder adhere thereto.

Details of the preferred embodiment of the inventive process will now be described with particular reference to FIG. 3.

In the first step of the process as shown at step 100, the contact sites or pads 12, on the substrate 10, to which the chip 20, is to be attached are planarized and this can be conveniently done using a qualified flat wheel grinder. The result that is desired is that there should be no plated metals left on the pad contact sites of the substrate 10, and that the pad contact sites are all typically flushed with the ceramic or upper surface 11. Any other means or process can be employed to achieve a surface not being flushed with the ceramic surface 11. However, for some applications there may be a pad 12, that is slightly above or below the ceramic surface 11. Typically a thickness of about 1 mil of base material from the pad 12, is removed and a grinding tool, such as Model TEG-160E3 supplied by Amada Metrecs Co. Ltd. could be used. Any other suitable treatment tool may be used that will provide satisfactory results. In a situation where the surface 21, of the pad 12, is clean and smooth, the grinding step or surface finishing may not be required.

For the purposes of illustration only the material for the pad 12, is assumed to be a solder non-wettable material, and the material for the pad 22, is assumed to be a solder wettable material. However, this same inventive process would be used if the materials for the pads 12 and 22, were reversed.

The carrier surface 11, and the pad surface 21, is then cleaned or etched by a vapor blast as shown by step 200. This step is necessary to give the base material or the solder non-wettable material, for example, a mixture involving molybdenum, an adequate surface roughness for the plating of the solder wettable material, for example, the nickel plating.

The surfaces 11 and 21, are etched using a mixture of water and abrasive (quartz-silicon) with particles of about 12 microns (in a range between about 9 and about 15 microns) using a pressure of 80 psi. A tool, such as, Model WB112-1 supplied by Pressure Blast Mfg. Co. has been found to be useful for such an etching or cleaning process of step 200.

The above prepared carrier pad surface 21, is then plated as shown at step 300 with a film 22, of solder wettable material 22, such as nickel 22, using an electroless process to a thickness of about 0.5 micrometers (+0.5/−0.2). The use of a plating tool supplied by STS, namely, STS Model No. US323-001 for approximately 200 seconds has been found satisfactory. Nickel is a solder wettable material and although it is found to be the preferred material, any other appropriate solder wettable material 22, may be used, such as copper and gold.

The solder wettable material or film 22, is then diffused into the solder non-wettable base material 12, of the contact pads 12, as shown by step 400. This step merges or combines the base material 12, and the nickel plated material 22, resulting in a contact or connecting pad 42. This is achieved by placing the carriers 10, as treated in accordance with the previously described steps, into a furnace which will bring the temperature up to about 860° C. A furnace supplied by Linn, Hersbruck has been used successfully for this purpose. The carrier 10, is then taken out after the diffusion between the solder wettable material 22, and solder non-wettable material 12, has taken place.

The sites where the pads 12, are located are then initially etched using a chemical iodine etch as shown by step 500. This iodine etch step will remove most of the solder wettable material 22, or nickel 22, that was previously plated and which had not diffused into the base material 12, in the previous step 400. This is done using a solution of iodine at a temperature of about 52° C. for about one minute. The etching tooling found useful was STS Model No. US232-003 from STS.

A second vapor blast step as shown at step 600 gives the base material 12, (a mixture involving molybdenum in the preferred embodiment), adequate surface roughness for the second plating of the solder wettable material 22, such as, nickel plating 22. This is done to make sure that solder wettable material 22, will adhere sufficiently and not peel off the surface 21, of the pad 12. A pressure of between about 50 psi and about 70 psi is preferably used during this second vapor blast, depending on the abrasive mixture etching capacity. The same tool, as used for step 200, is used in this step.

After the surface 21, has received the second vapor blast, the carrier pads 12, are then plated a second time, during step 700, with a nickel electroless process in a similar manner as for step 300 to a thickness of about 0.5 micrometers (+0.5/−0.2).

During a third and final etch (step 800), the pad sites are partially stripped of the solder wettable material 22, such as, nickel 22, by using a mechanical vapor-blast etch. The vapor blast tool that was used as above for step 200, is used here to create a final ratio of wettable and non-wettable areas (nickel-molybdenum areas in the preferred embodiment) at the contact points on the surface of the vias and pads. If this etching step was not used, a nickel coverage of about 80% to about 90% of the surface area may be obtained because when a molybdenum mixture is the non-wettable material, it may contain a certain amount of alumina on which the nickel will not plate.

About 20% to about 35% coverage of the surface area of the pad 42, with solder wettable material 14, or nickel, if used, is preferred with the type of carrier 10, and chip 20, used in order to obtain both good electrical contacts and an acceptable weak mechanical strength. This final ratio can be controlled by defining the right etch factor of the vapor blast. This etch factor of step 800 is really weak compared to the previous ones used in steps 200 and 600. Thus controlled etch is obtained by adjusting the pressure of the blast and/or the etching capacity of the mixture (worn abrasive, higher ratio of water/abrasive, etc.). The etching rate can be adjusted to the desired rate by changing some process parameters such as blast pressure, water/abrasive ratio or quality of the abrasive.

It should be noted that the preferred ratio above is dependent upon variables of the specific application and may very well be different for use of the process with other carriers, chips or needs.

The above process steps prepares the substrate 10, or the contact pads 12, on the carrier 10, prior to attaching the semiconductor chip 20, to be tested to the substrate 10, so as to provide a matrix of solder wettable areas 14, and solder non-wettable areas 16, in this preferred example, a matrix of molybdenum areas 16, and nickel areas 14. As has been previously described, other suitable solder wettable materials 14, and solder non-wettable materials 16, may be successfully used.

Figure 3:
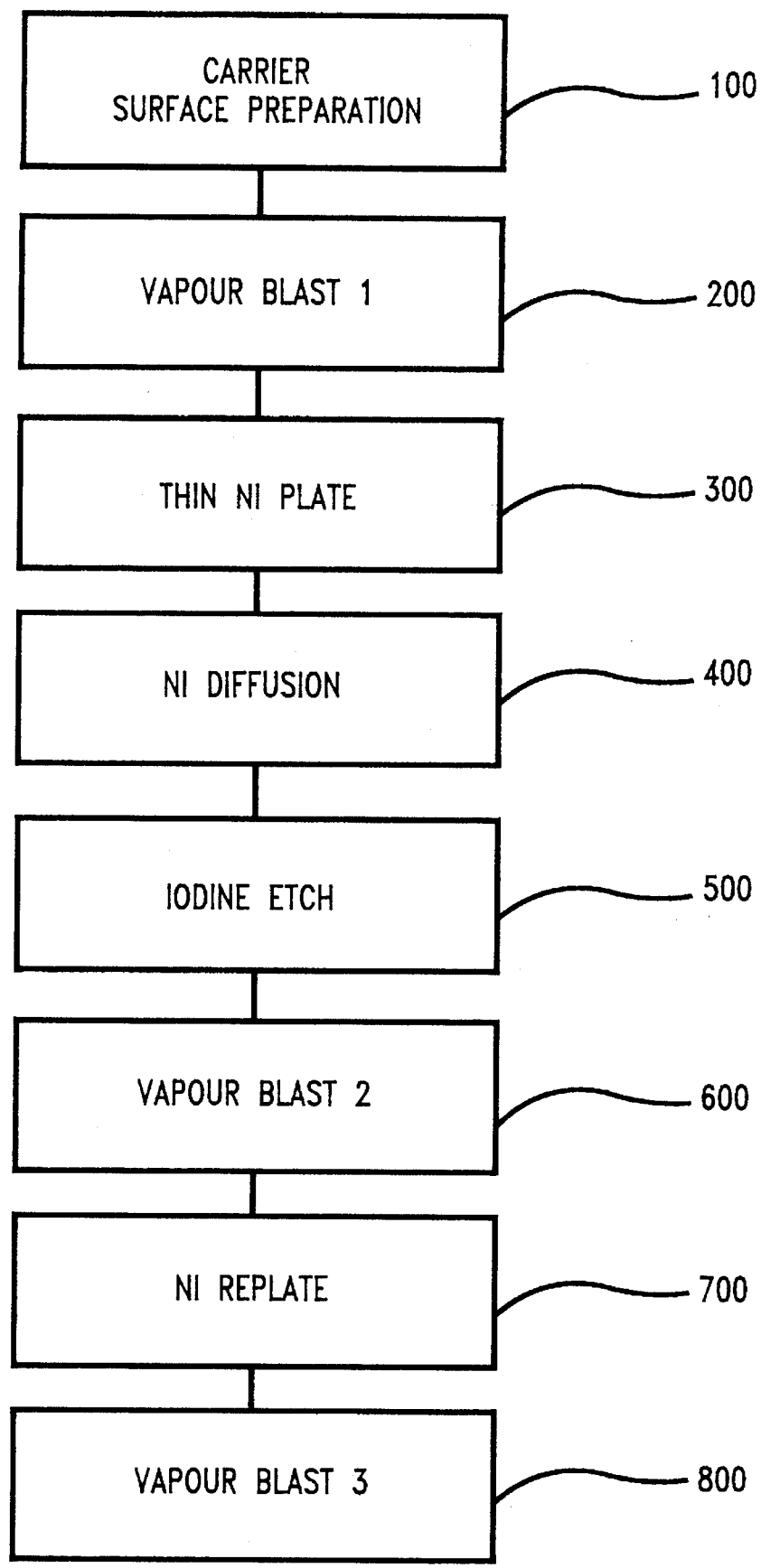
FIG. 3, is a flow chart showing the various steps in the inventive process of this invention.

Although a specific preferred embodiment of the inventive process has been described in conjunction with FIG. 3, many changes can be made to the process to still obtain useful and desired results. It has been found that use of the process as described tends to result in the maximum re-use of the carrier 10.

Variations in the process may readily be made if being able to re-use the carrier 10, to a lesser extent was acceptable. For example, eliminating the etching and vapor blast steps 500 and 600 as well as the second plating step 700 can be eliminated and still it has been found the carrier 10, may be re-used a reasonable number of times without having too great a buildup of solder on the carrier contact pads 42, during subsequent burn-in tests.

It is also possible to start with a contact pad 12, or base material 12, which is solder wettable material 14, as opposed to solder non-wettable material 16, and carry out the above described process steps by plating a solder non-wettable film 22, in order to arrive at a similar surface having an area of about 10% to about 45% covered with solder wettable material 14, and preferably an area of about 20% to about 35% covered with the solder wettable material 14. This would be readily apparent to those skilled in the art.

It is also appreciated that alternative techniques can be successfully employed for the various process steps described above and illustrated in FIG. 3 without departing from the scope of the invention. For example, instead of electroless plating described in conjunction with steps 300 and 700 and the diffusion of step 400, other alternatives to deposition of a film and combining it with the base material would include sputtering, screening, sintering and selective deposition as through appropriate photoresist masks.

In addition to the vapor blast and iodine etch processes as described above in steps 200, 500, 600 and 800, laser ablation and selective chemical etch using photoresist masks may, where appropriate, be employed to remove the excess material.

Figure 2:
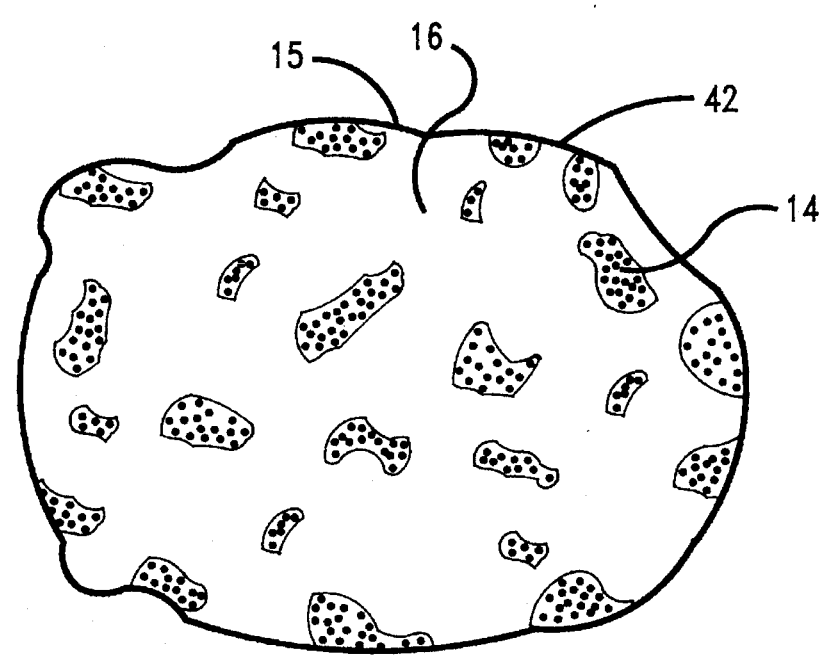
FIG. 2, shows a typical surface resulting from the use of the inventive process of this invention.

The surface resulting from the above described processes is shown in FIG. 2. This is a drawing based on an electron microscope image of the resulting surface. The illustrated pad 42, is typically a circular pad which is typically of the order of 100 microns in diameter. However, the pad 42, could be of any shape and/or size.

FIG. 2 illustrates the matrix or mixture of solder wettable regions 14, and solder non-wettable areas 16, on the surface, which in the preferred embodiment are made of nickel 14, and a molybdenum mixture 16, respectively.

It has been found that a surface having preferably about 20% to about 35% of the contact area of the carrier pad 42, consisting of solder wettable material 14, is the most useful for creating a temporary weld or joint when the carrier 10, and chip 20, are used. However, for some solder ball materials and applications a surface area having about 10% to about 45% of the contact area of the carrier pad 42, consisting of solder wettable material 14, would give acceptable results.

As indicated, this has resulted in the greatest number of satisfactory re-uses of the carrier 10, without such a resulting buildup of solder. This has also provided a readily fracturable connection with minimal damage to the carrier 10, and chip 20, upon separation which cannot be obtained elsewhere.

As has been noted, the semiconductor chip 20, has solder ball contacts 18, mounted thereon corresponding to the pad sites on the carrier 10. The chip 20, is temporarily attached to the prepared contact pad sites on the carrier 10, as described above, by partially melting or reflowing the solder balls 18, so that temporary electrical connections are made between the contact balls 18, on the chip 20, and the above prepared pad sites on the carrier 10.

The desired burn-in test was performed on the chip 20, using appropriate voltage and temperature criteria as may be desired and as is well known in the art.

The process described above as well as the various alternatives for preparing the surfaces of the contact pads 42, on the carrier 10, results in a matrix of solder wettable material 14, and solder non-wettable areas 16, forming the contact surfaces between the solder ball 18, of the chip 20, and the pads 42, of the carrier 10. In view of the presence of minute areas or regions of solder wettable material 14, and solder non-wettable material 16, the molten solder resulting from the reflow of the solder balls 18, only attaches to the solder wettable areas 14, of the matrix and not to the solder non-wettable areas 16, which form most of the surface and thus forming a somewhat weak mechanical connection.

The electrical connection that results from this invention between the carrier 10, and the chip 20, however, is good and does not interfere with the chip 20, burn-in test procedures.

The connection between the chip 20, and the substrate 10, however is mechanically weak. The chip 20, after the burn-in test can be easily removed using any appropriate well-known means, such as mechanical shear-off techniques, for removing the chip 20, from the carrier 10, without damaging either the chip 20, or the carrier 10.

For those chips 20, which passed the test and were without any defects, those removed chips 20, may then be subsequently permanently mounted on a device for incorporating into a product. However, those chips 20, in which defects were identified, the chip 20, can then be discarded or used in another products where the use of the defective chip would be acceptable. The carrier 10, can be used over and over many times for carrying out subsequent burn-in tests on other chips.

Incorporating the process described in this specification has been found to be very useful and a practical and an economical way of identifying those chips which should not be incorporated in finished products, thus resulting in being able to more economically manufacture semiconductor devices.

It has been found that a thin film of nickel which has been etched by a vapor blast is not easily wettable when it is diffused in the surface of molybdenum. This could be simply because the surface roughness of the molybdenum "hides" the nickel. However, after having joined a number of chips to the surface by reflowing the solder balls on the chips, it has been found that the nickel areas may gradually become covered with the solder and eventually will produce joints between the chip and the carrier which are too strong. Such a surface seems to become increasingly wettable. The results obtained and the number of re-uses for which the carrier is capable may be satisfactory and sufficient for some applications. However, in the preferred embodiment it was discovered that if the diffused nickel plating was etched with iodine that a sufficient amount of nickel would still remain to prevent the peeling of a second nickel plating. Even without a further step of diffusing this second nickel plating, it was found to adhere strongly to the surface. The final surface after the second plating step is etched was found to provide the most satisfactory wettable surface. It may be that the first nickel plating can be thought of as providing "roots" for the second plating to ensure that the second plating does not attach to the chips when they are removed.

The preferred embodiment of the invention has been described as preparing and treating contact points on a semiconductor chip carrier in order to create a detachable fracturable joint, as well as a semiconductor chip carrier. However, the disclosed invention has application in forming a fracturable connection between two appropriately treated surfaces and electrical contact points per se are not a requirement to the enjoyment and implementation of the disclosed invention.

Although it is apparent that a specific preferred embodiment of the process of creating a readily fracturable connection has been described using specific examples, as well as a semiconductor carrier, it will be apparent to those skilled in the art that many alternatives may be used without digressing from the spirit of the disclosed invention.

However, it should be noted that while the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process for creating a temporary and detachable connection between one surface which is partially non-wettable by solder and a second surface having a source of solder, comprising the steps of:
   (a) preparing a first surface having solder non-wettable material to adhere a film of solder wettable material;
   (b) depositing a film of solder wettable material onto said first surface;
   (c) heating said solder wettable material such that at least a portion of said solder wettable material combines with said solder non-wettable material of said first surface;
   (d) removing excess solder wettable material from said first surface and creating a third surface, wherein said third surface has areas of solder wettable material and solder non-wettable materials;
   (e) overlaying said second surface having said source of solder onto said third surface having said regions of solder wettable material and solder non-wettable material; and
   (f) reflowing said solder of said second surface to thereby form a temporary and detachable connection between said third surface which is partially non-wettable by solder and said second surface.

2. The process of claim 1, wherein said first surface is a contact pad on a carrier for mounting a semiconductor chip and said second surface consists of solder balls on a semiconductor chip.

3. The process of claim 1, wherein said solder wettable and solder non-wettable areas are formed on selected portions only of said first surface.

4. The process of claim 1, wherein the step of depositing a film of solder wettable material consists of plating said film on said first surface, and wherein said step of heating said solder wettable material into said first surface consists of diffusing said solder wettable material into said first surface.

5. The process of claim 1, wherein said solder non-wettable material is selected from the group consisting of molybdenum, tungsten, chrome and alumina/molybdenum and said solder wettable material is selected from the group consisting of nickel, copper and gold.

6. The process of claim 1, wherein said third surface consists of about 10% to about 45% of solder wettable material, and preferably about 20% to about 35% of solder wettable material.

7. A process for creating a temporary and detachable connection between one surface which is partially non-wettable by solder and a second surface having a source of solder, comprising the steps of:
   (a) preparing a first surface having solder wettable material to adhere a film of solder non-wettable material;
   (b) depositing a film of solder non-wettable material onto said first surface;
   (c) heating said solder non-wettable material such that at least a portion of said solder non-wettable material combines with said solder wettable material of said first surface;
   (d) removing excess solder non-wettable material from said first surface and creating a third surface, wherein said third surface has areas of solder wettable material and solder non-wettable materials;
   (e) overlaying said second surface having said source of solder onto said third surface having said regions of solder wettable material and solder non-wettable material; and (f) reflowing said solder of said second surface to thereby form a temporary and detachable connection between said third surface which is partially non-wettable by solder and said second surface.

8. The process of claim 1, wherein said first surface is a contact pad on a carrier for mounting a semiconductor chip and said second surface consists of solder balls on a semiconductor chip.

9. The process of claim 1, wherein said solder wettable and solder non-wettable areas are formed on selected portions only of said first surface.

10. The process of claim 1, wherein the step of depositing a film of solder non-wettable material consists of plating said film on said first surface, and wherein said step of heating said solder non-wettable material into said first surface consists of diffusing said solder non-wettable material into said first surface.

11. The process of claim 1, wherein said solder non-wettable material is selected from the group consisting of molybdenum, tungsten, chrome and alumina/molybdenum and said solder wettable material is selected from the group consisting of nickel, copper and gold.

12. The process of claim 1, wherein said third surface consists of about 10% to about 45% of solder wettable material, and preferably about 20% to about 35% of solder wettable material.

13. A process for creating detachable electrical connections between solder balls of a semiconductor chip and connecting pads of a carrier wherein the pads consist of a material which is solder non-wettable, by forming areas on the pads which consist of a matrix of solder wettable and solder non-wettable materials such that the chip can be readily removed from the carrier with minimal damage to the chip and carrier, comprising the steps of:

(a) treating each pad in order to create a roughened surface;
   (b) plating a film of solder wettable material onto said treated pads;
   (c) diffusing said film of solder wettable material into said solder non-wettable material of said pads;
   (d) removing excess portion of said solder wettable material which has not diffused into said pad from said pad;
   (e) plating at least one additional film of at least one solder wettable material onto the diffused surface of step (c);
   (f) removing excess portion of said additional film of said solder wettable material;
   (g) mounting said chip on said carrier such that said solder balls of said chip coincide and overlay said treated contact pads of said carrier; and
   (h) reflowing said solder of said solder balls in order to make electrical connections between said chip and said carrier.

14. The process of claim 13, wherein said pads of said carrier are levelled to ensure that they are substantially flush with the surface of said carrier.

15. The process of claim 13, wherein the steps of removing wettable material includes the use of a vapor-blast etch.

16. The process of claim 13, wherein said solder non-wettable material is selected from the group consisting of molybdenum, tungsten, chrome and alumina/molybdenum, and said solder wettable material is selected from the group consisting of nickel, copper and gold.

17. The process of claim 13, further including the steps of:
   conducting burn-in tests on said chip while it is attached to said carrier; and
   removing said chip from said carrier upon completion of said burn-in tests.

18. The process of claim 17, wherein the step of removing said chip from said carrier includes shearing the connections between said solder balls and said pads on said carrier.

19. The process of claim 13, wherein the step of removing excess portion of said solder wettable material includes the use of an iodine etch.

20. The process of claim 13, wherein the step of plating a film of solder wettable material consists of plating a film of solder wettable material to approximately 0.5 microns in thickness.

21. The process of claim 13, wherein said step of treating the pads includes grinding said pads to make them flush with the surface of said carrier and creating a roughened surface with at least one vapor blast etch.

22. The process of claim 13, wherein after said diffusion step, said pad consists of about 10% to about 45% of solder wettable material, and preferably about 20% to about 35% of solder wettable material.

* * * * *